United States Patent
Anzawa et al.

(10) Patent No.: US 7,034,540 B2
(45) Date of Patent: Apr. 25, 2006

(54) VOLTAGE DETECTION CIRCUIT FOR STORAGE DEVICES

(75) Inventors: Seiichi Anzawa, Nagano (JP); Hiroshi Nishizawa, Nagano (JP); Fujio Matsui, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 290 days.

(21) Appl. No.: 10/246,287

(22) Filed: Sep. 18, 2002

(65) Prior Publication Data

US 2003/0062903 A1 Apr. 3, 2003

(30) Foreign Application Priority Data

Sep. 28, 2001 (JP) .................. P .2001-303984

(51) Int. Cl.
*G01N 27/416* (2006.01)

(52) U.S. Cl. .................................................. 324/426

(58) Field of Classification Search ................ 324/426, 324/427, 430, 433, 434; 320/116, 118, 106, 320/137

See application file for complete search history.

(56) References Cited

U.S. PATENT DOCUMENTS

| | | | |
|---|---|---|---|
| 4,833,459 A | | 5/1989 | Geuer et al. ................ 340/636 |
| 5,712,568 A | * | 1/1998 | Flohr et al. ................. 324/434 |
| 5,912,544 A | * | 6/1999 | Miyakawa et al. ......... 320/106 |
| 6,091,226 A | * | 7/2000 | Amano ........................ 320/116 |
| 6,459,236 B1 | * | 10/2002 | Kawashima ................ 320/118 |
| 6,472,098 B1 | * | 10/2002 | Sawada et al. ............. 429/163 |
| 6,541,980 B1 | * | 4/2003 | Maki .......................... 324/426 |

FOREIGN PATENT DOCUMENTS

| | | |
|---|---|---|
| DE | 42 41 523 A1 | 6/1994 |
| DE | 100 09 618 A1 | 9/2000 |
| EP | 982788 * | 3/2000 |
| FR | 2-801-982 | 6/2001 |
| JP | 08140204 * | 5/1996 |
| JP | 2001-307782 | 11/2001 |
| WO | WO-9530905 * | 11/1995 |

OTHER PUBLICATIONS

German Patent Application No. 102 42 908 1 -35 Office Action dated Jan. 18, 2005 German Office Action (6 pages) English Translation of German Office Action (4 pages).
French Search Report dated Sep. 4, 2003 (3 pages).

* cited by examiner

*Primary Examiner*—Pia Tibbits
(74) *Attorney, Agent, or Firm*—Osha Liang LLP

(57) ABSTRACT

A voltage detection circuit for detecting terminal-to-terminal voltages of a plurality of storage devices B1 and B2 connected in series. In the voltage detection circuit for storage devices, voltage judgment units VPL-1, VPL-2, VPH-1 and VPH-2 are provided between the terminals of the plurality of storage devices respectively, and the detection result of the initial-stage voltage judgment unit is transmitted to the next-stage voltage judgment unit without being isolated, so that the judgment result of the final-stage voltage judgment unit is obtained.

2 Claims, 2 Drawing Sheets

US 7,034,540 B2

VOLTAGE DETECTION CIRCUIT FOR STORAGE DEVICES

BACKGROUND OF THE INVENTION

The present invention relates to a voltage detection circuit for storage devices, and particularly relates to a voltage detection circuit for detecting abnormality of respective terminal-to-terminal voltages of a plurality of storage devices connected in series.

A configuration in which a plurality of storage devices are connected in series to obtain a high voltage is used in batteries for electric automobiles, forklifts and the like by way of example.

In such a battery in which a plurality of storage devices have been connected in series, abnormality of voltage may be caused by a failure of the storage devices, consumption thereof, or the like, so as to damage the performance of the battery.

It is therefore necessary to provide a voltage detection circuit for the storage devices. This voltage detection circuit for the storage devices monitors the voltages of the respective storage devices, and outputs a detection signal designating the abnormality of voltage when any one of the monitored voltages is out of its specified value.

A related-art example of such a voltage detection circuit for storage devices will be described below with reference to FIG. 2. FIG. 2 is a circuit diagram showing a related-art voltage detection circuit.

In FIG. 2, the reference signs B1 to B4 represent storage devices; Q1 to Q4, semiconductor switching devices; q1 to q4, control signal generating transistors; Vp1 to Vp4, voltage judgment units; and PH0 to PH4, photo-couplers.

In FIG. 2, the storage devices B1 to B4 are connected in series, and the voltage detection units Vp1 to Vp4 are connected between terminals of the storage devices respectively.

In addition, the semiconductor switching devices Q1 to Q4 are connected between the storage devices B1 to B4 and the voltage judgment units respectively.

The base of the semiconductor switching device (e.g. transistor or FET) Q1 which is a control terminal is connected to be supplied with the output of the photo-coupler PH0 which is switched ON/OFF in accordance with an external control signal c.

On the other hand, the base of another semiconductor switching device Q2 which is a control terminal is connected to the collector of the control signal generating transistor q1 through a resistor.

The base of the control signal generating transistor q1 is voltage-divided by resistors and connected to the opposite ends of the voltage judgment unit Vp1 on the output side of the semiconductor switching device Q1.

In addition, the base of another semiconductor switching device Q3 which is a control terminal is connected to the collector of the control signal generating transistor q2 through a resistor.

The base of the control signal generating transistor q2 is voltage-divided by resistors and connected to the opposite ends of the voltage judgment unit Vp2 on the output side of the semiconductor switching device Q2.

Further, the base of further another semiconductor switching device Q4 which is a control terminal is connected to the collector of the control signal generating transistor q3 through a resistor.

The base of the control signal generating transistor q3 is voltage-divided by resistors and connected to the opposite ends of the voltage judgment unit Vp3 on the output side of the semiconductor switching device Q3.

Further, a terminal is led out from the collector of the control signal generating transistor q4 so as to connect the collector with a not-shown next-stage semiconductor switching device.

In addition, the base of the control signal generating transistor q4 is voltage-divided by resistors and connected to the opposite ends of the voltage judgment unit Vp4 on the output side of the semiconductor switching device Q4.

Judgment outputs (e.g. not lower than a predetermined voltage or not high than a predetermined voltage) from the voltage judgment units are extracted and supplied through the photo-couplers PH1 to PH4 respectively while being electrically isolated from one another.

In FIG. 2, the outputs of the photo-couplers PH1 to PH4 are connected in parallel so that an output a is supplied when any one of the terminal-to-terminal voltages of the storage devices B1 to B4 is not higher than the predetermined voltage or not lower than the predetermined voltage by way of example.

Next, the operation of the voltage detection circuit will be described in the circuit of FIG. 2.

When the output of the photo-coupler PH0 is supplied to the base of the semiconductor switching device Q1 in accordance with the external control signal c, a current flows from the emitter to the base in this semiconductor switching device Q1 so that the semiconductor switching device Q1 is turned ON.

When the semiconductor switching device Q1 is turned ON, a current from the collector of the semiconductor switching device Q1 flows from the base to the emitter in the control signal generating transistor q1 so that the control signal generating transistor q1 is turned ON.

Then, when the control signal generating transistor q1 is turned ON, a current flows from the emitter to the base in the semiconductor switching device Q2 so that the semiconductor switching device Q2 is turned ON.

Further, when the semiconductor switching device Q2 is turned ON, a current from the collector of the semiconductor switching device Q2 flows from the base to the emitter in the control signal generating transistor q2 so that the control signal generating transistor q2 is turned ON.

Then, when the control signal generating transistor q2 is turned ON, a current flows from the emitter to the base in the semiconductor switching device Q3 so that the semiconductor switching device Q3 is turned ON.

Further, when the semiconductor switching device Q3 is turned ON, a current from the collector of the semiconductor switching device Q3 flows from the base to the emitter in the control signal generating transistor q3 so that the control signal generating transistor q3 is turned ON.

Then, when the control signal generating transistor q3 is turned ON, a current flows from the emitter to the base in the semiconductor switching device Q4 so that the semiconductor switching device Q4 is turned ON.

On the contrary, when the external control signal c is absent, no current flows from the emitter to the base in the semiconductor switching device Q1. Therefore, the semiconductor switching device Q1 is turned OFF.

When the semiconductor switching device Q1 is turned OFF, the respective control signal generating transistors q1 to q4 are prevented from being turned ON. Thus, all the semiconductor switching devices Q1 to Q4 are OFF.

As described above, all the semiconductor switching devices Q1 to Q4 can be turned ON/OFF in accordance with the single external control signal c. Thus, the voltages of the storage devices B1 to B4 can be detected (judged) in the following manner by the voltage judgment units Vp1 to Vp4 connected through those semiconductor switching devices.

In FIG. 2, assume that the voltage judgment units VP1 to VP4 supply detection outputs to the photo-couplers PH1 to PH4 when input voltages to the voltage judgment units VP1 to VP4 are not higher than a predetermined voltage. In this case, if the output a is obtained when the external control signal c is present, it can be concluded that any one of the terminal-to-terminal voltages of the storage devices B1 to B4 is not higher than the predetermined voltage, or constituent parts of this circuit are abnormal.

On the contrary, assume that the voltage judgment units VP1 to VP4 supply detection outputs to the photo-couplers PH1 to PH4 when input voltages to the voltage judgment units VP1 to VP4 are not lower than a predetermined voltage. In this case, if the output a is obtained when the external control signal c is present, it can be concluded that any one of the terminal-to-terminal voltages of the storage devices B1 to B4 is not lower than the predetermined voltage, or constituent parts of this circuit are abnormal.

On the other hand, if the output a is obtained when the external control signal c is absent, it can be concluded that constituent parts of this circuit are abnormal.

In the circuit of FIG. 2, such detection mechanisms are combined so that the abnormality of the terminal-to-terminal voltages of the storage devices B1 to B4 and the abnormality of the constituent parts of this circuit can be judged.

In the circuit of FIG. 2, the abnormality of the terminal-to-terminal voltages of the storage devices B1 to B4 and the abnormality of the constituent parts of the circuit can be indeed judged, but a large number of photo-couplers PH1 to PH4 for electric isolation are required to extract the detection outputs of the respective voltage judgment units to the outside. Thus, there is a problem that the cost increases.

SUMMARY OF THE INVENTION

The invention is developed in consideration of the foregoing problem. An object of the invention is to provide a voltage detection circuit for storage devices connected in series, in which the required number of signal transmitting parts for extracting voltage judgment results to the outside is reduced so that the cost involved in manufacturing the apparatus can be reduced.

In order to attain the foregoing object, according to the invention, there is provided a voltage detection circuit for storage devices in order to detect terminal-to-terminal voltages of a plurality of storage devices connected in series. In the voltage detection circuit, voltage judgment units are provided between terminals of the plurality of storage devices respectively. The voltage detection circuit has a feature in that a desired one of the voltage judgment units is set as an initial stage, while the judgment result of the initial-stage voltage judgment unit is transmitted to the other voltage judgment units sequentially without being isolated, and a general judgment result of the voltage judgment units at initial to final stages is obtained. Further, the judgment result of the final-stage voltage judgment unit is outputted externally through a photo-coupler.

In such a manner, since it is not necessary to output a judgment result from the voltage judgment unit at every stage, it is not necessary to provide a photo-coupler for every stage. It is therefore possible to reduce the required number of photo-couplers for extracting the voltage judgment result to the outside. Thus, the cost involved in manufacturing the apparatus can be reduced.

Further, according to the invention, there is provided a voltage detection circuit for storage devices, wherein the initial-stage voltage judgment unit is set on a lower-voltage side of the plurality of storage devices connected in series while the final-stage voltage judgment unit is set on a higher-voltage side of the plurality of storage devices connected in series.

Accordingly, any voltage judgment result is transmitted from a lower-voltage-side voltage judgment unit to a higher-voltage-side voltage judgment unit. Thus, the base potential of each detection result transmitting transistor is higher (on the positive potential side) than the ground potential of the IC module to which the detection result transmitting transistor belongs. The voltage detection circuit is therefore suitable for forming the apparatus out of ICs.

Further, according to the invention, there is provided a voltage detection circuit for storage devices, wherein each of the voltage judgment units detects either a terminal-to-terminal voltage of a corresponding one of the storage devices which is not higher than a specified voltage, or the terminal-to-terminal voltage which is not lower than the specified voltage.

Accordingly, an under voltage can be detected when the terminal-to-terminal voltage of each storage device is not higher than the specified voltage. On the contrary, an overvoltage can be detected when the terminal-to-terminal voltage of each storage device is not lower than the specified voltage.

Further, according to the invention, there is provided a voltage detection circuit for storage devices, wherein the voltage judgment units output externally when any one of terminal-to-terminal voltages of the plurality of storage devices is out of a specified voltage range.

Accordingly, it is possible to monitor the plurality of storage devices connected in series easily as to whether the terminal-to-terminal voltages thereof are within the specified voltage range or not.

Further, according to the invention, there is provided a voltage detection circuit for storage devices, wherein the initial-stage voltage judgment unit self-diagnoses the voltage detection circuit in response to an external operation check signal supplied thereto compulsorily, and the external operation check signal is supplied through a photo-coupler.

Accordingly, it is possible to obtain a monitoring result in accordance with the external signal.

Further, according to the invention, there is provided a voltage detection circuit for storage devices, wherein semiconductor switching devices for switching ON/OFF sequentially in accordance with an external signal are connected between the plurality of storage devices and the plurality of voltage judgment units respectively, and the external signal is supplied through a photo-coupler.

Accordingly, the voltage detection circuit can be disconnected in accordance with necessity.

DETAILED DESCRIPTION OF THE PREFERRED EMBODIMENTS

Figure 1:
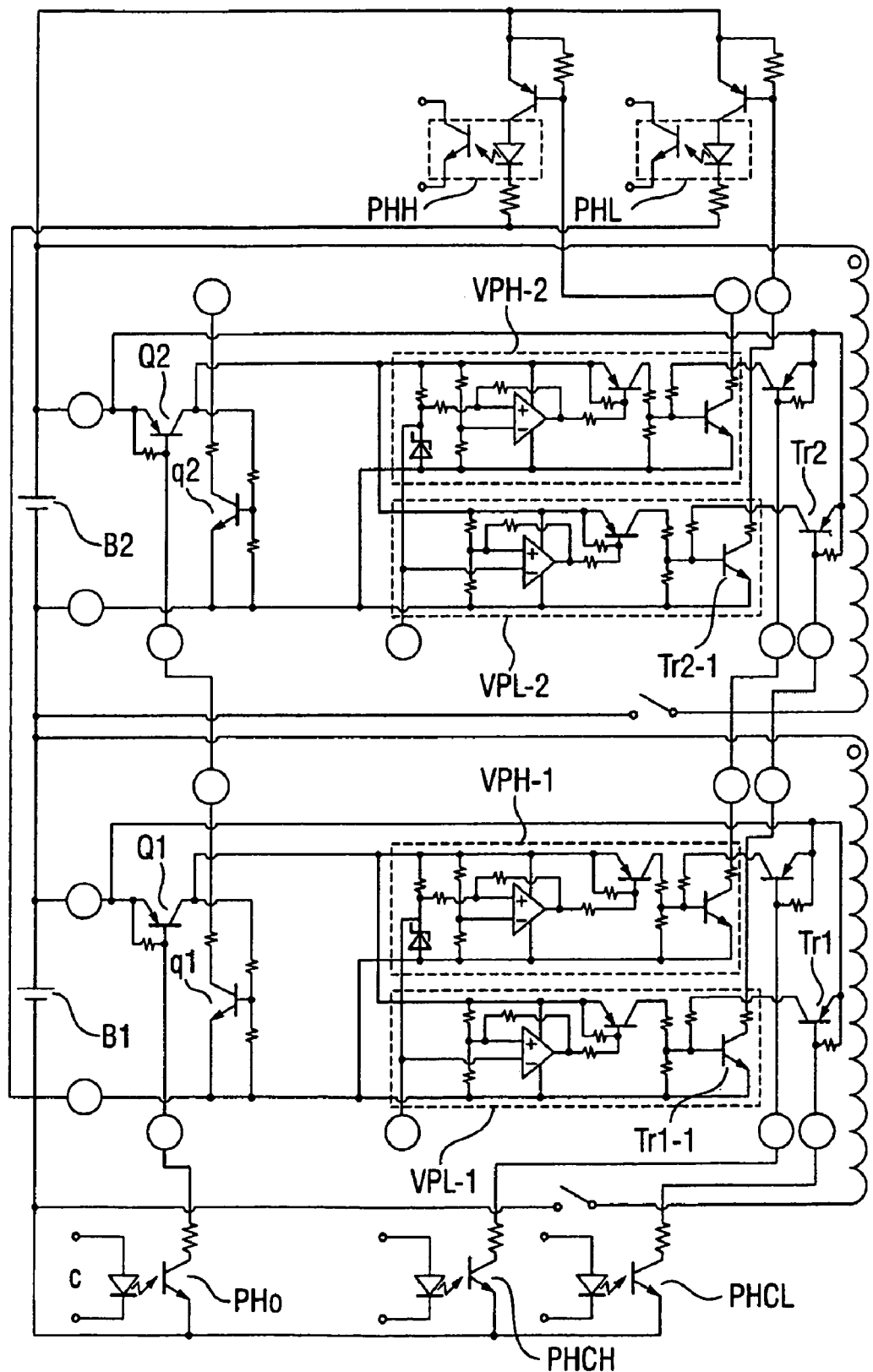
FIG. 1 is a circuit diagram showing the configuration of a voltage detection circuit for storage devices according to an embodiment of the invention.

An embodiment of the invention will be described below in detail with reference to the drawing. FIG. 1 is a circuit diagram of a voltage detection circuit according to this embodiment.

Figure 2:
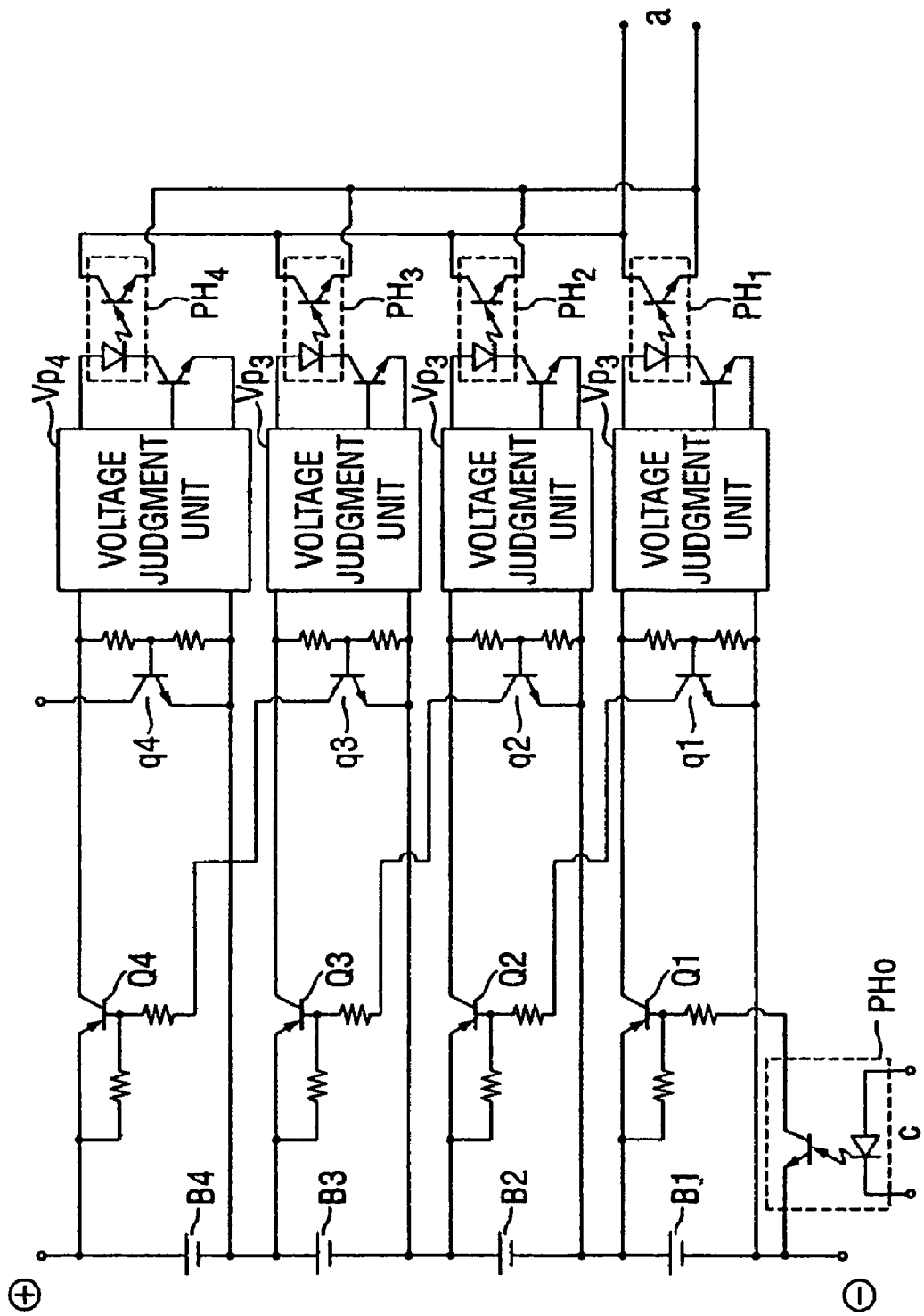
FIG. 2 is a circuit diagram showing the configuration of a related-art voltage detection circuit for storage devices.

In FIG. 1, the reference signs B1 and B2 represent storage devices (corresponding to the storage devices B1 to B4 in the related-art circuit of FIG. 2); Q1 and Q2, semiconductor switching devices (corresponding to Q1 to Q4 in FIG. 2); q1 and q2, control signal generating transistors (corresponding to q1 to q4 in FIG. 2); VPL-1 and VPH-1, first-stage (initial-stage) voltage judgment units (corresponding to Vp1 in FIG. 2); VPL-2 and VPH-2, second-stage (final-stage) voltage judgment units (corresponding to Vp4 in FIG. 2); and PH0, PHH and PHL, photo-couplers (corresponding to PH0 to PH4 in FIG. 2).

Incidentally, the portions designated by the symbols "o" represent terminals of IC modules when the circuits at the respective stages are made up of IC modules.

Although the example in which two storage devices are used is shown in FIG. 1, a desired plural number of storage devices may be connected in series, for example, four storage devices may be connected in series as shown in FIG. 2.

As shown in FIG. 1, the storage devices B1 and B2 are connected in series, and the voltage judgment units VPL-1, VPH-1, VPL-2 and VPH-2 are connected between terminals of the storage devices respectively. In addition, the semiconductor switching devices Q1 and Q2 are connected between the storage devices B1 and B2 and the voltage judgment units respectively.

The base of the semiconductor switching device (e.g. transistor or FET) Q1 which is a control terminal is connected to be supplied with the output of the photo-coupler PH0 which is switched ON/OFF in accordance with an external control signal c.

On the other hand, the base of the semiconductor switching device Q2 which is a control terminal is connected to the collector of the control signal generating transistor q1 through a resistor.

Then, the base of the control signal generating transistor q1 is voltage-divided by resistors and connected to the opposite ends of the voltage judgment units VPL-1 and VPH-1 on the output side of the semiconductor switching device Q1.

Further, a terminal is led out from the collector of the control signal generating transistor q2 so as to connect the collector with a not-shown next-stage semiconductor switching device.

In addition, the base of the control signal generating transistor q2 is voltage-divided by resistors and connected to the opposite ends of the voltage judgment units VPL-2 and VPH-2 on the output side of the semiconductor switching device Q2.

Next, the operation of the voltage detection circuit will be described in the circuit of FIG. 1.

When the output of the photo-coupler PH0 is supplied to the base of the semiconductor switching device Q1 in accordance with the external control signal c, a current flows from the emitter to the base in this semiconductor switching device Q1 so that the semiconductor switching device Q1 is turned ON.

When the semiconductor switching device Q1 is turned ON, a current from the collector of the semiconductor switching device Q1 flows from the base to the emitter in the control signal generating transistor q1 so that the control signal generating transistor q1 is turned ON.

Then, when the control signal generating transistor q1 is turned ON, a current flows from the emitter to the base in the semiconductor switching device Q2 so that the semiconductor switching device Q2 is turned ON.

Further, when the semiconductor switching device Q2 is turned ON, a current from the collector of the semiconductor switching device Q2 flows from the base to the emitter in the control signal generating transistor q2 so that the control signal generating transistor q2 is turned ON.

Then, when the control signal generating transistor q2 is turned ON, a current from the terminal flows from the emitter to the base in the not-shown next-stage semiconductor switching device.

On the contrary, when the external control signal c is absent, no current flows from the emitter to the base in the semiconductor switching device Q1. Therefore, the semiconductor switching device Q1 is turned OFF.

When the semiconductor switching device Q1 is turned OFF, the control signal generating transistor q1 is prevented from being turned ON. Thus, the semiconductor switching device Q2 is turned OFF.

As described above, all the semiconductor switching devices Q1 and Q2 can be turned ON/OFF in accordance with the single external control signal c. Thus, the voltages of the storage devices B1 and B2 can be detected (judged as to whether the terminal-to-terminal voltages of the storage devices are within a predetermined range or not) in the following manner by the voltage judgment units VPL-1, VPH-1, VPL-2 and VPH-2 connected through those semiconductor switching devices.

Of the voltage judgment units VPL-1, VPH-1, VPL-2 and VPH-2 in FIG. 1, the voltage judgment units VPL-1 and VPL-2 detect that the terminal-to-terminal voltages of the storage devices are not higher than a specified value. In FIG. 1, when an undervoltage check signal is provided through the photo-coupler PHCL, the detection result of the first-stage (initial-stage) voltage judgment unit (undervoltage) VPL-1 is transmitted to the final-stage voltage judgment unit VPL-2 without being isolated. Then, the detection result of the final-stage voltage judgment unit VPL-2 is outputted to the outside through the photo-coupler PHL while being isolated.

In FIG. 1, when the undervoltage check signal is supplied from the outside through the photo-coupler PHCL, a detection result transmitting transistor Tr1 is brought into continuity so as to send the detection result of the voltage judgment unit VPL-1 to the next stage through a detection result transmitting transistor Tr1-1. Thus, a detection result transmitting transistor Tr2 is brought into continuity.

In response to this continuity of the detection result transmitting transistor Tr2, the detection result of the next-stage voltage judgment unit VPL-2 is given through a detection result transmitting transistor Tr2-1 to the photo-coupler PHL for external output.

In FIG. 1, when an overvoltage check signal is provided through the photo-coupler PHCH, the detection result of the first-stage (initial-stage) voltage judgment unit (overvoltage) VPH-1 is transmitted to the second-stage (final-stage) voltage judgment unit VPH-2 without being isolated. Then, the detection result of the second-stage (final-stage) voltage judgment unit VPH-2 is outputted to the outside through the photo-coupler PHH while being isolated.

The detection result of an overvoltage is transmitted in the same manner as the case for an undervoltage.

In addition, according to the invention, it is not necessary to provide the foregoing configuration in which a detection result is transmitted from the lower-voltage-side voltage judgment unit VPL-1 or VPH-1 to the higher-voltage-side voltage judgment unit VPL-2 or VPH-2. For example, a detection result may be designed to be transmitted from the higher-voltage-side voltage judgment unit VPL-2 or VPH-2 to the lower-voltage-side voltage judgment unit VPL-1 or VPH-1. Alternatively, when four storage devices are connected in series as shown in FIG. 2 by way of example, the second stage may be set as the initial stage so that a detection result is transmitted sequentially to the fourth, third and first stages in this order. That is, any configuration may be adopted if a desired voltage judgment unit is set as the initial stage while the judgment result of the initial-stage voltage judgment unit is transmitted sequentially to the other voltage judgment units without being isolated, and the judgment result of the final-stage voltage judgment unit is outputted to the outside through a photo-coupler.

Thus, the need for providing a photo-coupler for outputting a detection result to the outside in every voltage judgment unit provided in every storage device is eliminated so that the cost involved in manufacturing the apparatus can be reduced.

In addition, in FIG. 1, a detection result is designed to be transmitted from the lower-voltage-side voltage judgment unit VPL-1 or VPH-1 to the higher-voltage-side voltage judgment unit VPL-2 or VPH-2 as described above.

Accordingly, when the circuits at the respective stages are constituted by IC modules (the portions designated by the symbols "o" in FIG. 1 are formed as terminals of the IC modules), the base potential of each detection result transmitting transistor Tr1, Tr2 becomes higher (on the positive potential side) than the ground potential of each IC module.

Thus, the configuration in which the initial stage is set on the lower voltage side while the final stage is set on the higher voltage side as shown in FIG. 1 is suitable for forming the apparatus out of ICs.

A voltage detection circuit for storage devices according to the invention is configured as follows. That is, in a voltage detection circuit for storage devices in order to detect terminal-to-terminal voltages of a plurality of storage devices connected in series, voltage judgment units are provided between terminals of the plurality of storage devices respectively, a desired one of the voltage judgment units is set as an initial stage, while the judgment result of the initial-stage voltage judgment unit is transmitted to the other voltage judgment units sequentially without being isolated, and a general judgment result of the voltage judgment units at the initial to final stages is obtained.

Accordingly, it is possible to reduce the number of parts for extracting the voltage judgment result to the outside. Thus, the manufacturing cost can be reduced.

Further, according to the invention, the judgment result of the final-stage voltage judgment unit is outputted externally through a photo-coupler. Accordingly, it is possible to provide a voltage detection circuit for storage devices having security high enough to electrically isolate the storage devices from external circuits.

Further, according to the invention, the initial-stage voltage judgment unit is set on a lower-voltage side of the plurality of storage devices connected in series while the final-stage voltage judgment unit is set on a higher-voltage side of the plurality of storage devices connected in series. Accordingly, the base potential of each detection result transmitting transistor is higher (on the positive potential side) than the ground potential of the IC module to which the detection result transmitting transistor belongs. Thus, the voltage detection circuit can be formed out of ICs easily.

Further, according to the invention, each of the voltage judgment units can detect either a terminal-to-terminal voltage of a corresponding one of the storage devices which is not higher than a specified voltage, or the terminal-to-terminal voltage which is not lower than the specified voltage. Accordingly, an undervoltage or an overvoltage can be detected.

Further, according to the invention, the voltage judgment units make an output to the outside when any one of the terminal-to-terminal voltages of the plurality of storage devices is out of a specified voltage range. Accordingly, it is possible to monitor the plurality of storage devices connected in series easily as to whether the terminal-to-terminal voltages thereof are within the specified voltage range or not.

Further, according to the invention, the initial-stage voltage judgment unit self-diagnoses the voltage detection circuit in response to an external operation check signal supplied thereto compulsorily. Accordingly, it is possible to obtain a monitoring result in accordance with the external signal.

Further, according to the invention, the external operation check signal is supplied through a photo-coupler. Accordingly, it is possible to provide a voltage detection circuit for storage devices having security high enough to electrically isolate the storage devices from external circuits.

Further, according to the invention, semiconductor switching devices for switching ON/OFF sequentially in accordance with an external signal are connected between the plurality of storage devices and the plurality of voltage judgment units respectively. Accordingly, the voltage detection circuit can be disconnected in accordance with necessity.

Further, according to the invention, the external signal is supplied through a photo-coupler. Accordingly, it is possible to provide a voltage detection circuit for storage devices having security high enough to electrically isolate the storage devices from external circuits.

What is claimed is:

1. A voltage detection circuit for storage devices in order to detect terminal-to-terminal voltages of a plurality of storage devices connected in series, comprising:
   voltage judgment units provided between terminals of said plurality of storage devices respectively; wherein:
      a desired one of said voltage judgment units is set as an initial stage, while a detection result of said initial-stage voltage judgment unit is transmitted to the other voltage judgment units sequentially without being isolated;
      a general judgment result of said voltage judgment units at initial to final stages is obtained; and
      each of said voltage judgment units detects either one of a terminal-to-terminal voltage of a corresponding one of said storage devices which is not higher than a specified voltage, and said terminal-to-terminal voltage which is not lower than said specified voltage.

2. A voltage detection circuit for storage devices in order to detect terminal-to-terminal voltages of a plurality of storage devices connected in series comprising:
   voltage judgment units provided between terminals of said plurality of storage devices respectively; wherein:
      a desired one of said voltage judgment units is set as an initial stage, while a detection result of said initial-stage voltage judgment unit is transmitted to the other voltage judgment units sequentially without being isolated;

a general judgment result of said voltage judgment units at initial to final stages is obtained; and said voltage judgment units output externally when any one of terminal-to-terminal voltages of said plurality of storage devices is out of a specified voltage range.

* * * * *

UNITED STATES PATENT AND TRADEMARK OFFICE
CERTIFICATE OF CORRECTION

PATENT NO.      : 7,034,540 B2                                      Page 1 of 1
APPLICATION NO. : 10/246287
DATED           : April 25, 2006
INVENTOR(S)     : Seiichi Anzawa et al.

It is certified that error appears in the above-identified patent and that said Letters Patent is hereby corrected as shown below:

On the cover page of the patent, (73) add a second assignee as follows:

Nagano Japan Radio Co., Ltd., Nagano (JP)

Signed and Sealed this

Fifth Day of September, 2006

JON W. DUDAS
*Director of the United States Patent and Trademark Office*